United States Patent [19]

Itoh

[11] Patent Number: 4,740,822
[45] Date of Patent: Apr. 26, 1988

[54] FIELD EFFECT DEVICE MAINTAINING A HIGH SPEED OPERATION IN A HIGH VOLTAGE OPERATION

[75] Inventor: Tomohiro Itoh, Tokyo, Japan

[73] Assignee: NEC Corporation, Tokyo, Japan

[21] Appl. No.: 724,456

[22] Filed: Apr. 18, 1985

[30] Foreign Application Priority Data

Apr. 19, 1984 [JP] Japan .................................. 59-78961

[51] Int. Cl.⁴ ............................................ H01L 29/78
[52] U.S. Cl. .................................. 357/23.1; 357/23.2; 357/22; 357/16; 357/41
[58] Field of Search ................. 357/22 MD, 22 A, 16, 357/23.2, 23.1, 41

[56] References Cited

U.S. PATENT DOCUMENTS 4,424,525  1/1984  Mimura ............................. 357/22 A
4,558,337  12/1985  Saunier et al. .................... 357/22 A

FOREIGN PATENT DOCUMENTS 58-93381  6/1983  Japan ............................ 357/22 MD
59-00968  1/1984  Japan ................................. 357/16
59-28383  2/1984  Japan ............................ 357/22 MD Primary Examiner—Andrew J. James
Assistant Examiner—Mark Prenty
Attorney, Agent, or Firm—Burns, Doane, Swecker & Mathis

[57] ABSTRACT

A field effect transistor comprises a gate electrode applied with a gate voltage, a channel forming region forming a channel in response to the gate voltage, and source and drain regions formed on both sides of the channel forming region, respectively, the channel forming region being made of a semiconductor material having an electron affinity which decreases as the distance from one surface thereof increases. The channel is formed at the surface of the channel forming region. An additional semiconductor material having an electron affinity lower than the electron affinity at the surface of the channel forming region may be interposed between the gate electrode and the channel forming region.

7 Claims, 4 Drawing Sheets

FIELD EFFECT DEVICE MAINTAINING A HIGH SPEED OPERATION IN A HIGH VOLTAGE OPERATION

BACKGROUND OF THE INVENTION

1. Field of the Invention

This invention relates to semiconductor field effect devices having high speed and high frequency performances, and more particularly to field effect transistors using one or more compound semiconductor materials.

2. Description of the Prior Art

Schottky gate field effect transistors (hereinafter, referred as MESFET's) for high frequency and high speed applications recently use GaAs having an electron mobility which is five to six times greater than Si. In such MESFET's, a GaAs layer is deposited on an insulator substrate and is heavily doped with N-type impurities, for example $10^{17}$ cm$^{-3}$. A Schottky metal layer is contacted with the GaAs layer to form a gate electrode. The electron mobility, however, is limited to a low value, for example 5,000 cm$^2$/V.Sec at 300° K., due to the scattering of ionized impurities.

To obtain an MESFET free from the effect of the scattering of ionized impurities, T. Mimura has proposed in U.S. Pat. No. 4,424,525 a usage of heterojunction structure in which an AlGaAs layer doped with donor impurities is deposited on a high purity GaAs layer. A Schottky gate electrode is contacted with the AlGaAs layer. With the heterojunction structure, electrons in the impurity doped AlGaAs move into the high purity GaAs to form an electron accumulation layer, that is so-called two-dimensional electron gas, in the high purity GaAs at the interface between the high purity GaAs layer and the impurity doped AlGaAs layer. The condition for forming the two-dimensional electron gas is that the electron affinity of the GaAs is higher than the AlGaAs. By the relationship between the electron affinities, a potential well for forming the two-dimensional electron gas is formed in the GaAs layer. Since the two-dimensional electron gas is produced in the high purity GaAs layer, the movement of electrons is not interfered with by the ionized impurities and results in an improved high mobility such as 6,000 cm$^2$/V.Sec at 300° K. or 20,000 cm$^3$/V.Sec at 77° K. The mobility is superior at a low temperature.

The proposed heterojunction MESFET achieves the improvement of high frequency and high speed characteristics to a considerable extent. It, however, still has a problem at high field operation. If the electrons in the two-dimensional electron gas are excited so as to exceed the upper energy level of energy sub-bands by the high electric field between source and drain regions, the electron mobility lowers due to inter-sub-bands scattering. Especially, since the energy level difference between energy sub-bands at the two-dimensional electron gas region in the proposed heterojunction MESFET is small, the inter-sub-bands scattering is apt to occur even by a small electrical field between source and drain regions. Thus, the high frequency and high speed operation of the proposed MESFET is easily deteriorated by the operating voltage between source and drain regions.

The proposed heterojunction MESFET has another problem. If the drain voltage $V_D$ is increased to exceed a voltage difference between the gate voltage $V_G$ and the gate threshold voltage $V_T$, the potential well for forming the two-dimensional electron gas disappears near the drain region and the energy band structure of the channel region near the drain region declines from the interface portion between the AlGaAs and GaAs layers to the inner portion of the GaAs layer. This allows the electron flow to expand into the inner portion of the GaAs layer and results in an increment of drain-conductance in saturation operation. The drain-conductance increment is remarkable in short-channel MESFET's.

SUMMARY OF THE INVENTION

The primary object of the present invention is to provide a field effect device having improved high frequency and high speed performances.

Another object of the present invention is to provide a heterojunction field effect device having a stable high speed operation even at a high voltage operation.

A further object of the present invention is to provide a heterojunction field effect device having a small and stable drain-conductance.

According to the present invention, there is provided a field effect device which comprises a gate electrode, a channel forming region in which a current channel is produced in accordance with a voltage applied to the gate electrode, and source and drain regions formed on both sides of the channel forming region, the channel forming region being made of a semiconductor material having a graded electron affinity. The electron affinity is highest at the surface of said semiconductor material where the current channel is formed and is decreased as the depth from the surface increases.

According to another aspect of the present invention, there is provided a heterojunction field effect device which comprises a channel region of a first semiconductor material having an electron affinity which is high at one surface thereof and gradually lowers, an additional region of a second semiconductor material formed on the channel region in contact with the one surface of the first semiconductor material, the second semiconductor material having an electron affinity which is lower than the electron affinity at the one surface of the first semiconductor material and being doped with impurities, a gate electrode formed on the additional region to form a Schottky barrier with the second semiconductor material, and source and drain regions formed on both sides of the channel region.

Since the electron affinity of the channel forming region of the first semiconductor material gradually lowers from the one surface to the inner portion, a deep potential well is produced at the interface of the first and second semiconductor materials. The energy level difference between sub-bands of electron energy states becomes large in the deep potential well. Therefore, the inter-sub-bands scattering does not occur so long as the source-drain voltage difference does not become considerably large. Thus, the high mobility is not deteriorated even in a high voltage operation.

Furthermore, since the channel forming region of the first semiconductor material has a lower electron affinity at the inside thereof than at its surface, the potential well for defining the region of current channel of the two-dimensional electron gas does not disappear near the drain region even if the drain voltage is considerably high. The path of electron flow is stably limited in the potential well throughout the region between the source and drain regions. Thus, the drain-conductance increment does not occur in the saturation operation.

BRIEF DESCRIPTION OF THE DRAWING

The above and further objects, features and advantages of the present invention will become more apparent from the following detailed description taken in conjunction with the accompanying drawings, wherein.

Figure 1:
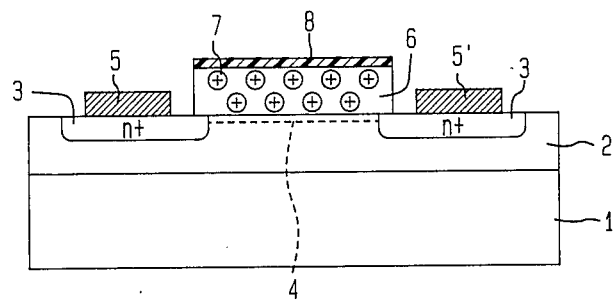
FIG. 1 is a sectional view of a heterojunction MESFET in the prior art.

A MESFET conventionally proposed is shown in the sectional view of FIG. 1. A semi-insulating GaAs substrate 1 is used as a starting material on which is deposited a high purity GaAs layer 2 doped with no impurity. N+-source and drain regions 3 are separately formed in the GaAs layer 2. On the surface of the GaAs layer 2 between the source and drain regions 3, Si-doped AlGaAs layer 6 of N-type conductivity is deposited. Ionized Si-impurities 7 are distributed in the AlGaAs layer 6. A gate electrode 8 is formed on the AlGaAs layer 6 with a metal forming a Schottky barrier with the AlGaAs layer 6. Source and drain electrodes 5 are attached to the source and drain regions 3.

Figure 2:
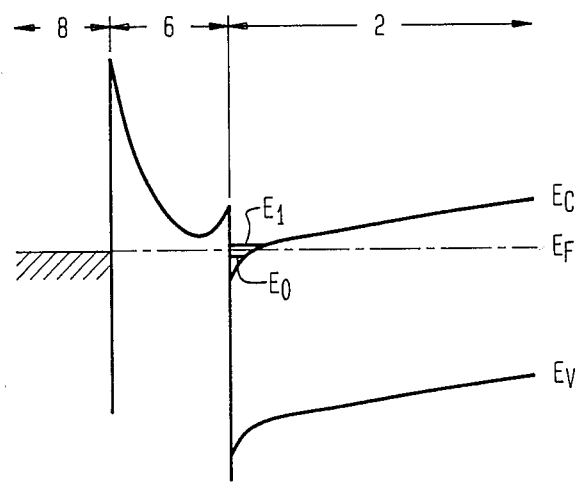
FIG. 2 is an energy band diagram at the thermal equiblium at the section of the gate electrode portion of the heterojunction MESFET in the prior art.

Here a normally-on type MESFET will be considered with FIGS. 1 and 2. The electron affinity of GaAs is larger than that of AlGaAs. At the interface of the heterojunction between GaAs and AlGaAs layers 2 and 6, a triangular potential well is formed inside the GaAs layer 2. Electrons in the Si-doped AlGaAs layer 6 are accumulated in the potential well to form a two-dimensional electron gas which contributes to the conductivity between the source and drain regions 3. The two-dimensional electron gas is modulated by the gate voltage.

In the potential well, quantum energy levels of electrons are formed. Here, for facilitating an understanding, the potential incline of the potential well in the GaAs layer 2 is assumed to be constant. In other words, the electrical field in the potential well in the perpendicular direction is assumed to be a constant value $F_s$. The energy level $E_i (i=0, 1, 2 \ldots)$ measured from the lowest energy at the bottom of the conduction band of GaAs at the heterojunction interface can be approximately expressed as follows:

$$E_i = \left(\frac{\hbar^2}{2m^*}\right)^{\frac{1}{3}} \left[\frac{3}{2} \pi \ eF_s \cdot (i + \tfrac{3}{4})\right]^{\frac{2}{3}} \quad (1)$$

where m* is an effective mass of electron in GaAs, e is a charge of electron, and ℏ is a value of Planck's constant h divided by $2\pi$. In FIG. 2, $E_0$ and $E_1$ are shown as examples.

In a usual operation where the electrical field is low such that the electron distribution function is not deviated from the thermal equiblium state, Fermi level $E_F$ exists between the energy levels $E_0$ and $E_1$ as shown in FIG. 2. Electrons move under a condition that their energies distribute between the energy level $E_0$ and the Fermi level $E_F$. If, however, the electrical field becomes so large that the energies of electrons exceed the energy level $E_1$, the so-called inter-sub-bands scattering occurs to lower the electron mobility. In the conventional structure of the heterojunction MESFET, the lowest level of the conduction band of GaAs sharply drops near the interface of the heterojunction but slowly increases at a portion far from the interface, causing a small electrical field in a direction perpendicular to the interface. This small electrical field makes the difference between the energy levels $E_0$, and $E_1$ and $E_2$. Therefore, even by a relatively small electrical field between source and drain regions, the lowering of electron mobility based on the inter-sub-bands scattering becomes notable and deteriorates the high speed characteristics.

Figure 3:
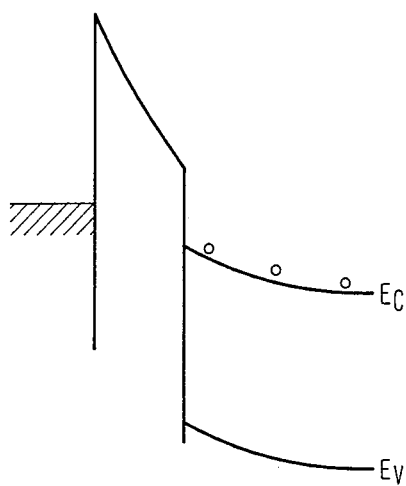
FIG. 3 is an energy band diagram at the section of the channel region near the drain region when a high voltage is applied to the drain region of the heterojunction MESFET in the prior art.

Another problem occurs when the voltage $V_D$ at the drain region becomes so high that it exceeds the difference between the voltage $V_G$ at the gate electrode and the threshold voltage $V_T$. In such a case, the energy band diagram at the channel region near the drain region changes as shown in FIG. 3 in which the potential well for forming the two-dimensional electron gas disappears. Electrons which are shown in FIG. 3 by circles flow through a wide portion of GaAs layer 2, resulting in an increase of drain-conductance in saturation operation. This increment of the drain-conductance is remarkable in short channel FET's and is another cause for deterioration of high frequency and high speed characteristics.

DETAILED DESCRIPTION OF PREFERRED EMBODIMENTS

Figure 4:
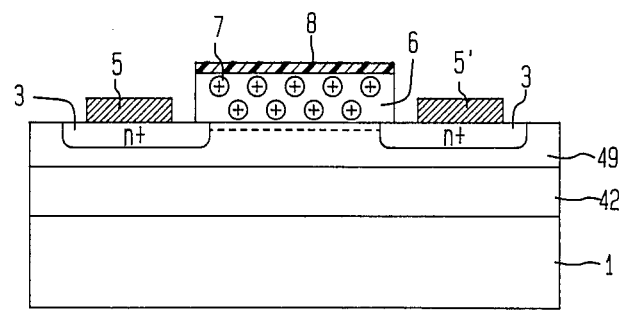
FIG. 4 is a sectional view of a heterojunction MESFET according to a first embodiment of the present invention.
Figure 5:
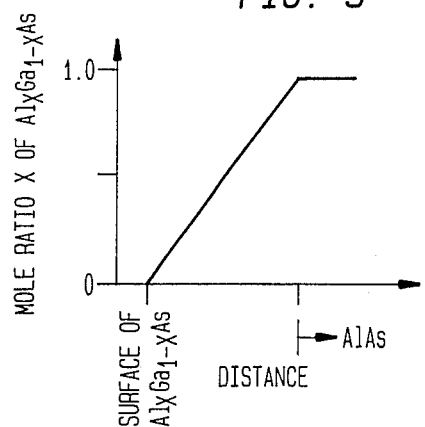
FIG. 5 is a diagram showing a variation of mole ratio X in the $Al_xGa_{1-x}As$ which is used in the first embodiment of the present invention.

Now, a first preferred embodiment of the present invention will be described with reference to FIGS. 4, 5 and 6. A semi-insulating GaAs substrate 1 is used as a starting material. A high purity AlAs layer 42 is deposited on the GaAs substrate 1 by molecular beam epitaxy with a thickness of 3,000 Å. A high purity $Al_xGa_{1-x}As$ layer 49 is further deposited on the AlAs layer 42 by molecular beam epitaxy with a thickness of 3,500 Å. The mole ratio X is continuously changed from 1 to 0. That is, the $Al_x$-$Ga_{1-x}As$ layer 49 is AlAs at the interface with the AlAs layer 49 and is GaAs at the top surface. Such change of the mole ratio X is shown in FIG. 5 as one example. Source and drain regions 3 are separately formed in the $Al_xGa_{1-x}As$ layer 49 by highly diffusing N-type impurities. On a portion of the $Al_xGa_{1-x}As$ layer 49 between the source and drain regions 3, an N type AlGaAs layer 6 doped with donor impurities such as silicon with a concentration of $2\times 10^{17}$ cm$^{-3}$ is deposited by molecular beam epitaxy with a thickness of 900 Å. In the N type AlGaAs layer 6, ionized donor impurities 7 are distributed. A metal such as aluminum which forms a Schottky barrier with the AlGaAs is deposited on the N type AlGaAs layer 6 as a gate electrode. Source and drain electrodes 5 are formed in contact with the source and drain region 3, with an alloy Au-Ge/Au which ohmically contacts the AlGaAs.

At the interface of the AlGaAs layer 6 and the $Al_xGa_{1-x}As$ layer 49, the $Al_xGa_{1-x}As$ layer 49 is GaAs. Here, the electron affinity of GaAs is larger than AlGaAs. Therefore, a triangular potential well is formed at the interface between the AlGaAs layer 6 and the $Al_xGa_{1-x}As$ layer 49 but inside the $Al_xGa_{1-x}As$ 49. Electrons produced by the donor impurities in the AlGaAs layer 6 are accumulated in the potential well to form a two-dimensional electron gas. The two-dimensional electron gas is modulated by the voltage applied at the gate electrode 8. This operation is similar to the conventional MESFET shown in FIGS. 1, 2 and 3.

Figure 6:
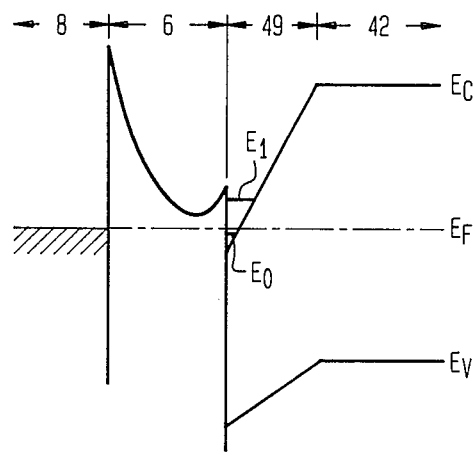
FIG. 6 is an energy band diagram at the section of the gate electrode portion of the heterojunction MESFET according to the first embodiment of the present invention.

The energy band diagram at a portion of the gate electrode 8 and thereunder is shown in FIG. 6. The energy band structure in the $Al_xGa_{1-x}As$ layer 49 is different from the conventional MESFET. At the interface between the AlGaAs layer 6 and the $Al_xGa_{1-x}As$ layer 49, the band structure is the same as the conventional MESFET, but the lowest energy of the conduction band of $Al_xGa_{1-x}As$ layer linearly rises up to the lowest energy of the conduction band of AlAs layer 42. As a result, a deep potential well is formed at the interface between the AlGaAs layer 6 and the $Al_xGa_{1-x}As$ layer 49 inside the $Al_xGa_{1-x}As$ layer 49. Due to such a deep potential well, the difference between the energy levels $E_0$ and $E_1$ is wide, as is apparent from the above-explained equation (1). Therefore, electrons staying at the lower energy level $E_0$ cannot move its energy state to the upper energy level $E_1$, unless a considerably high electrical field is applied. In other words, unless a considerably high drain voltage is applied, the inter-sub-bands scattering does not occur and the original high electron mobility is maintained. The good high speed and high frequency operation is kept at a high voltage operation.

Furthermore, as shown in FIG. 6, the lowest energy level of the conduction band of the $Al_xGa_{1-x}As$ rises up to a high energy level. For this reason, even if the drain voltage $V_D$ is so high that it exceeds the difference between the gate voltage $V_G$ and the threshold voltage $V_T$, the potential well does not disappear near the drain region. This means, even by such high drain voltage $V_D$, the path of current flow limited in the narrow potential well, results in no increment of drain-conductance in saturation operation. This effect becomes dominant in a shallow junction MESFET.

Other combinations of semiconductor materials applicable to the first embodiment are a combination of InP as the layer 42, $In_xGa_{1-x}P$ as the layer 49 and AlGaAs doped with donor impurities as the layer 6 and a combination of GaAs as the layer 42, $In_xGa_{1-x}As$ as the layer 49 and InAlAs doped with donor impurities as the layer 6. In each combination, the mole ratio X is a small value at the interface with the layer 6 and increases in accordance with the distance from the interface with the layer 6 so that an electron affinity decreases in accordance with the distance from the interface with the layer 6.

Figure 7:
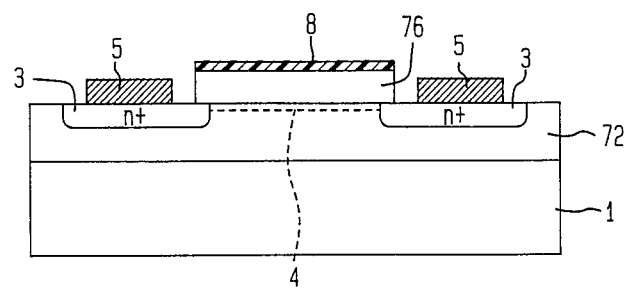
FIG. 7 is a sectional view of a heterojunction MESFET according to the second embodiment of the present invention.
Figure 8:
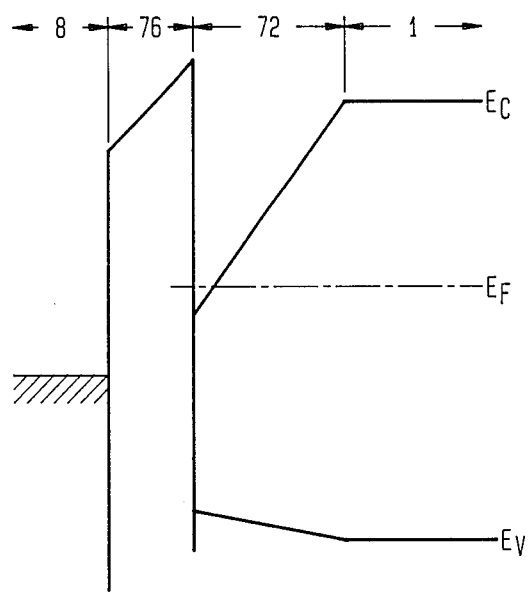
FIG. 8 is an energy band diagram at the section of the gate electrode portion of the heterojunction MESFET according to the second embodiment of the present invention when a positive voltage is applied to the gate electrode.

The present invention may be applied to an insulated gate type heterojunction field effect device. FIGS. 7 and 8 are such examples. On a semi-insulating GaAs substrate 1, $Ga_xIn_{1-x}As$ layer 72 is deposited by molecular beam epitaxy with a thickness of 2,000 Å. The mole ratio X is "1" at the surface of the GaAs substrate 1 and is decreased linearly to "0.3". Source and drain regions 3 are separately formed by diffusing donor impurities with a high concentration. On the surface of the $Ga_xIn_{1-x}As$ layer 72, $SiO_2$ layer 76 is deposited with a thickness of 800 Å. A metal of AuGe/Au alloy is selectively deposited on the $SiO_2$ layer 76 and the source and drain regions 3 as a gate electrode 8 and source and drain electrodes 5 and 5'.

The energy band diagram of the above-mentioned structure is shown in FIG. 8. The lowest energy level of the conduction band of the $Ga_xIn_{1-x}As$ layer 72 increases from the interface with the $SiO_2$ layer 76 to the interface with the GaAs substrate 1. By application of positive voltage to the gate electrode 8, the lowest energy level of the conduction band of the $Ga_xIn_{1-x}As$ layer 72 lowers below the Fermi level $E_F$ and produces a conductive channel of the two-dimensional electron gas.

According to such insulated gate field effect transistor, since the lowest energy band of conduction band of $Ga_xIn_{1-x}As$ rises up to a high value, the difference between energy levels $E_0$ and $E_1$ is wide, as is apparent from the equation (1). Therefore, the inter-sub-bands scattering does not occur even in high voltage operation and thus the original high electron mobility is maintained. Furthermore, due to the lowest energy level of conduction the band of the $Ga_xIn_{1-x}As$ layer 72 which sharply rises up to high value, the potential well for forming the two-dimensional electron gas does not disappear in the channel portion near the drain region which is applied with a high voltage. The current channel does not spread near the drain region, resulting in no increment of drain-conductance in saturation operation even in a high voltage operation.

Suitable other semiconductor material may be changeable with the $Ga_xIn_{1-x}As$ for the layer 72. Such suitable semiconductor material should have an electron affinity decreasing in accordance with the distance from the interface with the $SiO_2$ layer 76. An example is $In_xGa_{1-x}P$ in which the mole ratio X increases in accordance with the distance from the interface with the $SiO_2$ layer 76.

Although some embodiments of the present invention have been explained hereinbefore, it is apparent that the present invention is not limited to the above embodiments. Any suitable combination of semiconductor materials may be used, as explained above. The present invention may be applicable to devices other than a transistor, for example a charge coupled device. In the charge coupled devices, the source and drain regions are charge injection and charge detection regions and a plurality of gate electrodes are aligned between the charge injection and charge detection regions.

What is claimed is:

1. A field effect transistor comprising:
   a gate electrode applied with a gate voltage;
   an insulator film formed under said gate electrode;
   a channel-forming semiconductor region formed under said gate electrode in contact with said insulator film, said channel-forming semiconductor region primarily consisting of first and second semiconductor materials, said second semiconductor material having an electron affinity lower than said first semiconductor material, the content of said first semiconductor material in said channel-forming semiconductor region decreasing with distance from an upper surface thereof contacted with said insulator film, and said channel forming region forming a conductive channel in response to said gate voltage; and source and drain regions formed respectively on both sides of said channel-forming semiconductor region.

2. A field effect transistor as claimed in claim 1, wherein said first semiconductor material is selected from a group of InAs and GaP, and said second semiconductor material is selected from a group of GaAs and InP.

3. A field effect transistor as claimed in claim 2, wherein the content of said second semiconductor material increases with depth from zero at said upper surface, and the content of said first semiconductor material decreases with depth to thirty percent at a bottom of said channel-forming semiconductor region.

4. A field effect device comprising a channel forming region of a semiconductor material having an electron affinity which lowers in accordance with the depth from one surface thereof, an insulator material formed on said one surface and a control electrode formed on said insulator material, wherein said semiconductor material is selected from a group of $Ga_xIn_{1-x}As$ and $In_xGa_{1-x}P$ in which the mole ratio x increases as the depth from said surface increases.

5. A field effect device comprising a channel forming region of a semiconductor material having an electron affinity which lowers in accordance with the depth from one surface thereof, an insulator material formed on said one surface and a control electrode formed on said insulator material, wherein said control electrode is a gate electrode and said field effect device further comprises source and drain regions formed on both sides of said channel forming region, respectively, and wherein said semiconductor material is selected from a group of $Ga_xIn_{1-x}As$ and $In_xGa_{1-x}P$ in which the mole ratio x increases as the depth from said one surface increases.

6. A field effect transistor comprising:
a substrate of semi-insulating GaAs;
a first semiconductor layer of pure AlAs formed on said substrate;
a second semiconductor layer of a semiconductor material formed on said first semiconductor layer, said second semiconductor layer having a bottom surface contacting said first semiconductor layer and an upper surface, and said semiconductor material being $Al_xGa_{1-x}As$ in which the mole ratio X increases from 0 at said upper surface to 1 at said bottom surface;
source and drain regions separately formed in said second semiconductor layer to extend from said upper surface;
a third semiconductor layer formed on and contacting said upper surface of said second semiconductor layer located between said source and drain regions, said third semiconductor layer being formed of AlGaAs doped with donor impurities; and
a gate electrode formed on and contacting said third semiconductor layer.

7. A field effect transistor comprising:
a substrate of semi-insulating GaAs;
a semiconductor layer formed on said substrate, said semiconductor layer having an upper surface on the side opposite said substrate, and said semiconductor layer being formed of $Ga_xIn_{1-x}As$ in which the mole ratio x increases with depth from said upper surface from 0.3 to 1.0;
source and drain regions separately formed in said semiconductor layer to extend from said upper surface;
an insulator layer formed on said upper surface of said semiconductor layer located between said source and drain regions; and
a gate electrode of metal formed on said insulator layer.

* * * * *